(12) United States Patent
Ashwood Smith

(10) Patent No.: US 6,968,994 B1
(45) Date of Patent: Nov. 29, 2005

(54) RF-ID FOR CABLE MANAGEMENT AND PORT IDENTIFICATION

(75) Inventor: Peter Ashwood Smith, Hull (CA)

(73) Assignee: Nortel Networks Ltd, (CA)

( * ) Notice: Subject to any disclaimer, the term of this patent is extended or adjusted under 35 U.S.C. 154(b) by 0 days.

(21) Appl. No.: 10/885,273

(22) Filed: Jul. 6, 2004

(51) Int. Cl.[7] .............................................. G06F 17/00
(52) U.S. Cl. ................. 235/375; 235/472.02; 235/487; 235/435; 385/101; 385/24
(58) Field of Search ................................ 385/100, 101, 385/24; 235/375, 492, 449, 451, 435, 472, 235/472.02, 383; 705/28, 16, 22; 340/572.1, 340/825.49, 572.8; 398/58; 359/118; 355/200.5

(56) References Cited

U.S. PATENT DOCUMENTS

| | | | | |
|---|---|---|---|---|
| 4,476,469 A | * | 10/1984 | Lander ................... | 340/825.49 |
| 4,656,463 A | * | 4/1987 | Anders et al. ........... | 340/573.4 |
| 4,862,160 A | * | 8/1989 | Ekchian et al. .......... | 340/10.32 |
| 5,334,044 A | * | 8/1994 | Falossi et al. ............... | 439/491 |
| 5,640,002 A | * | 6/1997 | Ruppert et al. ........ | 235/462.46 |
| 5,689,238 A | * | 11/1997 | Cannon, et al. .......... | 340/572.1 |
| 5,703,347 A | * | 12/1997 | Reddersen et al. .... | 235/462.15 |
| 5,747,786 A | * | 5/1998 | Cargin et al. .......... | 235/462.46 |
| 5,763,867 A | * | 6/1998 | Main et al. ............ | 235/462.46 |
| 5,764,043 A | * | 6/1998 | Czosnowski et al. ......... | 324/66 |
| 5,859,419 A | * | 1/1999 | Wynn .......................... | 235/487 |
| 6,282,350 B1 | * | 8/2001 | Takahashi et al. ............ | 385/88 |
| 6,354,493 B1 | * | 3/2002 | Mon .......................... | 235/380 |
| 6,847,856 B1 | * | 1/2005 | Bohannon ................... | 700/115 |
| 6,877,663 B2 | * | 4/2005 | Kelly et al. ............ | 235/462.15 |
| 2002/0008690 A1 | * | 1/2002 | Cooper ....................... | 345/156 |
| 2002/0043559 A1 | * | 4/2002 | Wrasman et al. ........... | 235/435 |
| 2002/0047777 A1 | * | 4/2002 | Casden .................... | 340/10.32 |
| 2002/0070862 A1 | * | 6/2002 | Francis et al. ........... | 340/572.1 |
| 2002/0167397 A1 | * | 11/2002 | Eroglu et al. .............. | 340/10.6 |
| 2002/0180588 A1 | * | 12/2002 | Erickson et al. ........... | 340/10.2 |
| 2004/0046663 A1 | * | 3/2004 | Jesser ...................... | 340/572.1 |
| 2004/0065741 A1 | * | 4/2004 | Reddersen et al. .... | 235/462.45 |
| 2004/0069851 A1 | * | 4/2004 | Grunes et al. .............. | 235/435 |
| 2004/0074963 A1 | * | 4/2004 | Pierce et al. ................ | 235/383 |
| 2004/0074976 A1 | * | 4/2004 | Becker et al. .............. | 235/492 |
| 2004/0085191 A1 | * | 5/2004 | Horwitz et al. ............ | 340/10.3 |
| 2004/0100383 A1 | * | 5/2004 | Chen et al. ................ | 340/572.1 |
| 2004/0101304 A1 | * | 5/2004 | McGregor ................... | 398/71 |
| 2004/0111335 A1 | * | 6/2004 | Black et al. .................. | 705/28 |
| 2004/0156601 A1 | * | 8/2004 | Koyasu et al. .............. | 385/100 |
| 2004/0184747 A1 | * | 9/2004 | Koyasu et al. .............. | 385/101 |
| 2004/0198222 A1 | * | 10/2004 | Ertin et al. ................ | 455/41.1 |
| 2005/0135269 A1 | * | 6/2005 | Saint-Hilaire et al. ...... | 370/254 |

* cited by examiner

*Primary Examiner*—Karl D. Frech
*Assistant Examiner*—Daniel Walsh
(74) *Attorney, Agent, or Firm*—Steubing McGuinness + Manaras LLP

(57) ABSTRACT

A Radio Frequency Identification ("RF-ID") device is affixed to a cable to identify the cable, i.e., distinguish the cable from other cables. A handheld RF-ID reader is used to identify particular cables by detecting the RF-ID associated with the cable. Short range RF-ID readers are embedded in a network device proximate to ports to determine which cable is connected with which port. A configurable cross-connect between the port and internal circuitry is configured based on the detected RF-ID to make predetermined interconnections. Consequently, proper interconnections may be achieved by connecting the cabling with any of a plurality of ports.

26 Claims, 2 Drawing Sheets

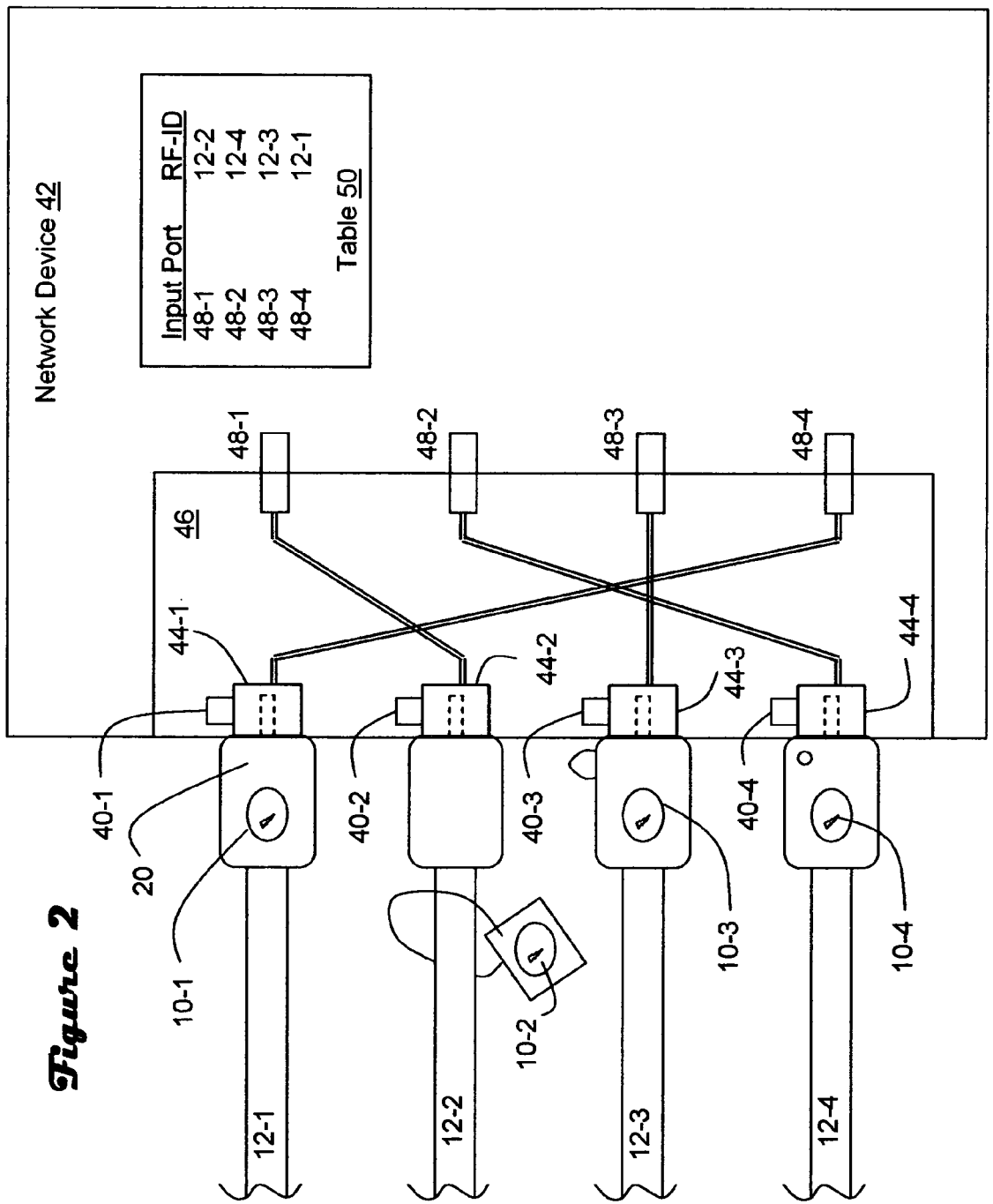

RF-ID FOR CABLE MANAGEMENT AND PORT IDENTIFICATION

FIELD OF THE INVENTION

This invention is generally related to network communications equipment, and more particularly to optical and electrical cabling.

BACKGROUND OF THE INVENTION

Network communications equipment such as routers and switches are interconnected via optical or electrical cabling which carries the signals which are processed by the equipment. Typically, the equipment is situated in an environmentally hardened enclosure, or a wiring closet, central office or point-of-presence office which is environmentally controlled. Because the cost of space in these environments is high, the equipment is commonly organized in the most compact manner that is practical. As a result, there is often a confusing collection of cabling run through the environment to interconnect the equipment within the environment to both other equipment within the environment and equipment outside of the environment. This presents a problem to field technicians responsible for installing and maintaining the equipment because it is important that specific cables are connected to specific places on the equipment.

It is known to attach identifying tags to cabling. In particular, a physical tag with a written label is attached to a cable to identify the cable. This may be as simple as attaching a paper tag with a tie-wrap or writing on a piece of tape that is adhered to the cable. However, physical tags may become separated from cabling and the labels may be rendered illegible. Further, locating a particular tag amongst a great many tagged cables in a crowded environment may be difficult.

It is also known to use unique connectors. The connectors may be affixed to multiple cables and have a geometry that allows insertion into only one type of device in one particular way. However, the connectors must be connected to the cabling in the proper way. Further, designing and manufacturing unique connectors is relatively costly because each can only serve a particular function and production runs tend to be in relatively small numbers.

Radio Frequency Identification ("RF-ID") technology, although nascent, is known for improving supply chain efficiency by facilitating tracking of goods. For example, RF-ID may displace the bar codes currently used to identify products. An RF-ID tag is a small, inexpensive circuitry chip which stores data such as a product's expiration date and Electronic Product Code ("EPC"). The circuitry is responsive to a particular RF signal transmitted by a reader to generate a corresponding signal including the stored data. The circuitry may be passive or active. Passive circuitry employs the energy of the reader excitation signal to generate the corresponding signal. Active circuitry employs an internal power source such as a battery to generate the corresponding signal. The range of the corresponding signal is dependent on various factors, but may be effective up to ten meters.

SUMMARY OF THE INVENTION

The invention is predicated in part on the recognition that RF-ID tags and readers can be designed with particular features and range limitations which can be used to advantage for interconnection of conduits such as electrical and optical cabling, and also for hydraulic, pneumatic and other conduits which must be connected with a device in a particular manner.

In accordance with the present invention, a Radio Frequency Identification ("RF-ID") device is affixed to a cable to identify the cable, i.e., distinguish the cable from other cables. An RF-ID reader may be employed in conjunction with the RF-ID to obtain usable data which identifies the cable to a field technician. For example, the reader and RF-ID cabling tags may function such that all tags within a predetermined range are read and displayed by the reader. Alternatively, the reader can be configured to read only a particular tag. Alternatively, an individual tag may be operative in response to a configured reader to prompt visible and audible responses which may be recognized by the field technician. Alternatively, an individual tag may be read by a reader associated with a piece of network equipment and employed to automatically create the appropriate internal connections to connect the cable associated with the tag.

The invention advantageously facilitates equipment maintenance and installation. A field technician can quickly narrow a search for a particular cable to a predetermined range by moving the reader around the environment until the RF-ID tag associated with the cable responds. The search may be further facilitated by a visible or optical signal. In the case where a reader is associated with the equipment, the field technician need not even find one particular point of connection in order to properly connect the cabling.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

FIG. 2 is a diagram illustrating semi-automated cabling connection using RF-ID tags.

DETAILED DESCRIPTION OF EXEMPLARY EMBODIMENTS

Figure 1:
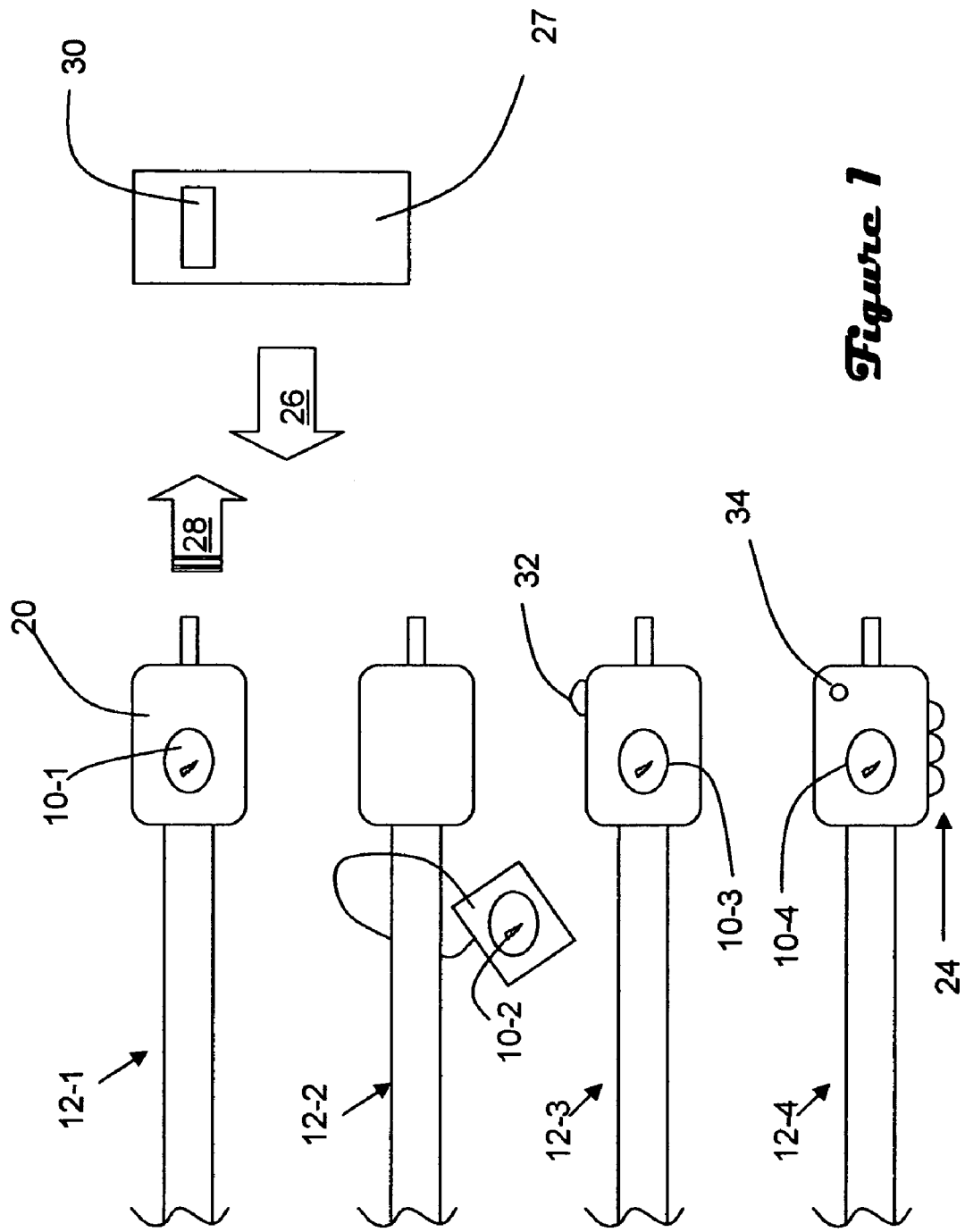
FIG. 1 is a diagram illustrating identification of cabling with RF-ID tags.

Referring to FIG. 1, RF-ID tags are employed to identify and distinguish cabling. An RF-ID tag 10-1, 10-2, 10-3, 10-4 is affixed to each cable of a plurality of cables 12-1, 12-2, 12-3, 12-4. In order to facilitate subsequent connection of the cable, the RF-ID tags are affixed proximate to each end of the cable. For example, the tag 10-1 may be embedded in a connector 20 positioned at the end of the cable. Alternatively, the RF-ID tag 10-2 may be mounted on a physical tag 22 clipped-onto or around the cabling 12-2 proximate to the connector. The embedded RF-ID tag may be preferable for new installations, while the RF-ID tag which can be attached in the field may be preferable for retrofit installations.

Each RF-ID tag 10 includes stored data which uniquely identifies the cable to which the tag is affixed. In particular, each tag may store for transmission 64–128 bits of data consisting of multiple fields and sub-fields. The cable identification information stored in each tag may be manually assigned or automatically assigned. For example, the identification information may be assigned by an OA&M system or routing software. Naming conventions for identifying cables are known. However by way of example the data may indicate the purpose and type of the cable such as "T1 0115 1A 15 A FPL1," where "T1" indicates the cable type, "0115" indicates a building, "1A" indicates a telecommunications room, "15" indicates a port number, "A" indicates a communications panel, and "FPL1" indicates a fiber panel. In the case of a tagged optical fiber, the data may also indicate the fiber type so that the properties for a laser that will be used to produce signals transmitted on the fiber may be selected either automatically or manually.

The cable identification data is initially stored in the RF-ID tag via a configuration procedure. Tags may be auto-configured and field-configured. Auto-configuration may be accomplished by manufacturing the cabling inclusive of the RF-ID tags with predetermined identification data, or machine-configuring the tags prior to embedding them in a connector or physical tag. Field configuration may be accomplished via devices 24 such as DIP switches or small wheels which can be set by field technicians.

The RF-ID tags are operative in response to an excitation signal 26 of specific frequency or within a range of frequencies to produce a response signal 28 indicative of the data stored by the RF-ID tag 10. However, the RF-ID tags and reader may be implemented in a variety of ways depending on the desired result. In one embodiment, all RF-ID tags 10 within a predetermined range of a handheld reader 27 are responsive to the reader signal 26. For example, in response to the signal 26 at a predetermined strength generated by the reader, all RF-ID tags within one meter of the reader which are responsive to that particular reader signal 26 may produce corresponding signals 28. As a practical matter, the RF-ID tags may employ the energy of the excitation signal to produce the response signal. The corresponding response signals are received by the handheld reader 27 and displayed in a list on a screen 30 which is incorporated into the reader. Hence, a field technician using the handheld reader could scan for a particular cable by moving the reader about until the desired cable is displayed by the reader, at which point the field technician would know that the desired cable is within one meter of the reader. By adjusting the power level of the reader signal 26 it may be possible to adjust the range of the search. For example, the search may be initiated with a high power setting to locate the cable within several meters, and then be narrowed by decreasing the power of the signal and thereby decreasing the range at which the RF-ID tag is responsive to the reader signal.

In an alternative embodiment the reader and RF-ID tag are configured to scan for an individual cable or group of cables. For example, the reader may be configured to generate a signal 26 at a frequency for which only one RF-ID tag or group of tags is responsive. Hence, a field technician can more easily locate the cabling by selecting the appropriate frequency for the reader signal and scan without the need to select the appropriate identification from a list. Alternatively, the reader signal 26 may include a passcode key which is interpreted by the RF-ID tags such that only one cable is operative in response to the passcode key. In particular, although all of the RF-ID tags may be responsive to the frequency on which the passcode key is transmitted, circuitry within the RF-ID tag processes the key to prevent generation of the corresponding signal if corresponding data stored by the RF-ID tag does not match the key of the reader signal.

In addition to generating the corresponding signal 28 which indicates stored identification data, the RF-ID tags may be operative to prompt a secondary signal to facilitate their location by a field technician. For example, the RF-ID tag circuitry may be associated with an optical device 32 such as a Light Emitting Diode ("LED") which is illuminated in conjunction with generation of the response signal 28. Alternatively, the RF-ID circuitry may be associated with an audio device 34 such as a piezo-electric device to generate an audible signal in conjunction with generation of the response signal.

Referring now to FIG. 2, RF-ID tags 10 are employed with readers 40-1, 40-2, 40-3, 40-4 embedded in a network device 42 to facilitate connection of cabling. In particular, each connection point, i.e., external ports 44-1, 44-2, 44-3, 44-4, on the network device includes a corresponding reader 40-1, 40-2, 40-3, 40-4 embedded in the device proximate to the port. The RF-IDs are embedded in the cabling connectors as described above with unique identification data usable by an OA&M system and routing software, such as link identifiers. However, The RF-ID tags and readers are configured to have a relatively small active range, e.g., on the order of millimeters, which is less than the distance between physical ports on the network device. This may be accomplished via generation of a relatively low power reader signal and also via implementation of the RF-ID tag circuitry. Consequently, the RF-ID tag data is read by the embedded reader only when the cable is quite close to, or connected to, the port, and only the RF-ID tag of the connected cable is detected by the reader for that port.

The information from the embedded readers 40 indicating which cable is connected with a particular port is used to configure interconnection between the cable and the appropriate internal circuitry of the network device 42. In particular, a re-writable cross-connect 46 is disposed between the external ports 44-1 through 44-4 and corresponding internal ports 48-1, 48-2, 48-3, 48-4. The cross-connect may be implemented in software, hardware or firmware using techniques known in the art. An interconnection table 50 maintained by the network device or an OAM device is employed to configure the cross-connect when a cable is connected with an external port. The table includes a list of cable RF-IDs and corresponding internal ports. When the cable is connected with an external port 44, the RF-ID of the cable is detected by the reader associated with the port. Subsequently, the detected RF-ID is employed as an index into the table to determine the internal port corresponding to the RF-ID. When the corresponding internal port is determined, the cross-connect is configured to provide a connection between the external port and the corresponding internal port. If the cable is detached from the external port, as detected by the absence of an RF-ID signal between tag and reader, the cross-connect connection corresponding to the port may be removed. Hence, the cabling may be connected with the network device in a variety of ways to achieve proper interconnections.

Cabling connected in the described manner may be employed to facilitate fault detection and isolation, and also to indicate fault potential. The RF-IDs may include sub-fields indicating shared risks. For example, bits 20–30 could be employed to indicate a trench identifier or DWDM that an optical fiber traverses. In the event of a break, it is likely that other fibers sharing the same identifier would also experience the fault. Consequently, the RF-ID sub-fields can be employed to analyze which fibers are likely to suffer from a break, and a particular break can be identified by matching the RF-ID sub-fields.

It should be noted that the RF-IDs described with respect to FIG. 2 may be operative with the handheld reader 27 described with respect to FIG. 1. Even though the network device may be operative to automatically configure internal connections to accommodate interconnection with the cabling in a variety of ports, field technician personnel may wish to locate particular cables on occasion. Consequently, the RF-ID tags may be responsive to both the readers embedded in the network device and the handheld reader.

In an alternative embodiment the RF-ID tag 10 is writeable or re-writeable by network devices. For example, the data in the RF-ID tag may be written in accordance with information provided by the OA&M system or routing software when the cable is connected with the external port of the network device.

In view of the description above, it will be understood by those of ordinary skill in the art that modifications and variations of the described and illustrated embodiments may be made within the scope of the inventive concepts. Moreover, while the invention is described in connection with various illustrative structures, those of ordinary skill in the art will recognize that the invention may be employed with other structures. Accordingly, the invention should not be viewed as limited except by the scope and spirit of the appended claims.

What is claimed is:

1. Apparatus for detecting identification information associated with a network communications cable having a Radio Frequency Identification ("RF-ID") tag, the RF-ID tag having stored therein the identification information, and for employing that information, comprising:
    a network device having:
        an embedded reader operable to generate a signal for which the RF-ID tag is operative in response to transmit the identification information, the reader being further operative to receive the identification information; and
        a processor operable to employ the received identification information to configure the network device.

2. The apparatus of claim 1 wherein the reader includes a display for displaying the identification information.

3. The apparatus of claim 1 wherein the reader is operative to generate the signal at one of a plurality of selectable frequencies.

4. The apparatus of claim 1 wherein the reader is operative to generate the signal at one of a plurality of selectable power levels.

5. The apparatus of claim 1 wherein the reader is operative to generate the signal with a selected one of a plurality of keying codes embedded therein, the RF-ID tag being operative in response to selected ones of the keying codes.

6. The apparatus of claim 1 wherein the cable includes, at least at one end, a connector and the RF-ID tag is embedded in the connector.

7. The apparatus of claim 1 wherein the RF-ID tag is affixable to an existing cable.

8. The apparatus of claim 1 wherein the RF-ID tag is operative in response to the reader signal to prompt a response selected from the group consisting of: optical response and audible response.

9. The apparatus of claim 1 wherein the RF-ID tag includes an interface for manually setting the identification information.

10. The apparatus of claim 1 wherein the reader is embedded in the network device proximate to an external port such that the reader receives the identification information when the cable is connected to the port.

11. The apparatus of claim 1 further including a table which cross-references identification information with internal ports and a configurable interconnect disposed between the external ports and the internal ports, whereby the received identification information is employed to determine configuration of the interconnect in order to achieve predetermined interconnection between the cable and one of the internal ports.

12. The apparatus of claim 1 wherein properties of the cable are embedded in the RF-ID tag information for use by an attached device.

13. The apparatus of claim 12 wherein the information includes an indication of optical fiber type for selection of laser properties.

14. A method for detecting identification information associated with a network communications cable by a Radio Frequency Identification ("RF-ID") tag having stored therein the identification information, and for employing that information, comprising the steps of:
    employing a reader to generate a signal for which the RF-ID tag is operative in response to transmit the identification information, the reader being further operative to receive the identification information, and wherein the reader is embedded in a network device;
    receiving, by the reader, the identification information; and
    employing the received identification information to configure the network device.

15. The method of claim 14 including the further step of displaying the identification information on the reader.

16. The method of claim 14 including the further step of generating, with the reader, the signal at one of a plurality of selectable frequencies.

17. The method of claim 14 including the further step of generating, with the reader, the signal at one of a plurality of selectable power levels.

18. The method of claim 14 including the further step of generating, with the reader, the signal with a selected one of a plurality of keying codes embedded therein, the RF-ID tag being operative in response to selected ones of the keying codes.

19. The method of claim 14 wherein the cable includes, at least at one end, a connector and the RF-ID tag is embedded in the connector.

20. The method of claim 14 wherein the RF-ID tag is affixable to an existing cable.

21. The method of claim 14 including the further step of the RF-ID tag prompting, in response to the reader signal, a response selected from the group consisting of optical response and audible response.

22. The method of claim 14 wherein the RF-ID tag includes an interface for manually setting the identification information.

23. The method of claim 14 wherein the reader is embedded in the network device proximate to an external port and including the further step of receiving, by the reader, the identification information of the cable when the cable is connected to the port.

24. The method of claim 14 further including a table which cross-references identification information with internal ports and a configurable interconnect disposed between the external ports and the internal ports, and including the further step of employing the received identification to determine configuration of the interconnect in order to achieve predetermined interconnection between the cable and one of the internal ports.

25. The method of claim 14 including the further step of embedding in the RF-ID tag information an indication of properties of the cable for use by an attached device.

26. The method of claim 25 wherein the information includes an indication of optical fiber type for selection of laser properties.

* * * * *